United States Patent [19]
Takasu et al.

[11] Patent Number: 5,534,722
[45] Date of Patent: Jul. 9, 1996

[54] INSULATOR SUBSTRATE FOR A LIGHT VALVE DEVICE HAVING AN ELECTROSTATIC PROTECTION REGION

[75] Inventors: Hiroaki Takasu; Kunihiro Takahashi; Tsuneo Yamazaki, all of Tokyo, Japan

[73] Assignee: Seiko Instruments Inc., Japan

[21] Appl. No.: 206,768

[22] Filed: Mar. 7, 1994

[30] Foreign Application Priority Data

| Mar. 8, 1993 | [JP] | Japan | 5-047021 |
| Mar. 9, 1993 | [JP] | Japan | 5-048402 |
| Mar. 9, 1993 | [JP] | Japan | 5-048403 |
| Feb. 18, 1994 | [JP] | Japan | 6-021205 |

[51] Int. Cl.$^6$ .......................... H01L 27/01; H01L 27/12; H01L 23/62
[52] U.S. Cl. .......................... 257/347; 257/350; 257/355; 257/360; 257/361
[58] Field of Search .......................... 257/59, 72, 347, 257/350, 351, 352, 355, 356, 357, 360, 361, 362

[56] References Cited

U.S. PATENT DOCUMENTS

| 4,133,000 | 1/1979 | Greenstein | 357/46 |
| 4,963,970 | 10/1990 | Throngnumchai et al. | 257/355 |
| 4,989,057 | 1/1991 | Lu | 257/350 |
| 5,246,870 | 9/1993 | Merchant | 257/347 |

FOREIGN PATENT DOCUMENTS

| 0470371 | 2/1992 | European Pat. Off. | 257/355 |
| 0474474 | 3/1992 | European Pat. Off. | 257/66 |
| 0497980 | 8/1992 | European Pat. Off. | 257/66 |
| 55-105361 | 8/1980 | Japan | 257/350 |
| 4-114476 | 4/1992 | Japan | 257/347 |

OTHER PUBLICATIONS

Patent Abstract of Japan, vol. 17, No. 112 (P-1498) 8 Mar. 1993.
Patent Abstract of Japan, vol. 5, No. 113 (E-066) 22 Jul. 1981.

Primary Examiner—Steven H. Loke
Attorney, Agent, or Firm—Adams & Wilks

[57] ABSTRACT

A semiconductor on insulator substrate has improved electrostatic performance without sacrificing the performance of commonly integrated high-speed integrated circuitry. The semiconductor on insulator substrate includes a single crystal semiconductor thin film having an integrated circuit region and an electrostatic protection region. The thickness of the single crystal semiconductor thin film is greater in the electrostatic protection region than in the integrated circuit region to thereby allow high-speed operation of devices formed in the integrated circuit region. Such a substrate has particular application as a driving substrate for a light valve. In such a device, the integrated circuit region includes thin film switching transistors for selectively applying a voltage to the liquid crystal layer and thin film driving transistors for driving the thin film switching transistors. The electrostatic protection region includes an electrostatic protection device electrically connected to the integrated circuit region, and the electrostatic protection device is effective to protect the driving transistors from exposure to an excess of electrostatic charge.

13 Claims, 5 Drawing Sheets

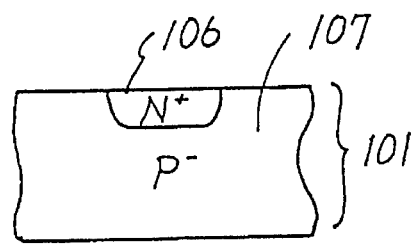
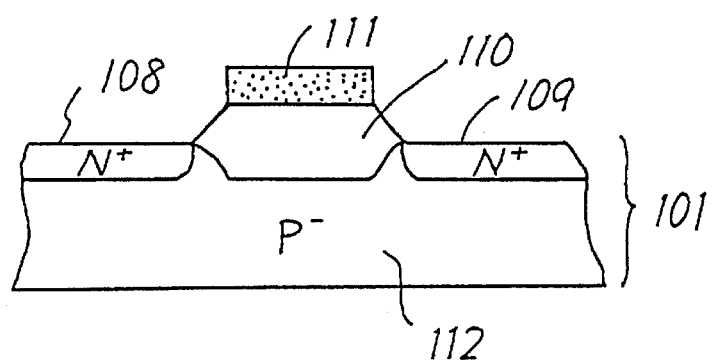
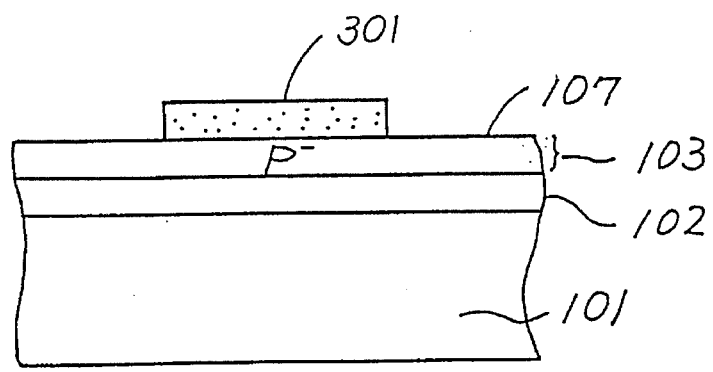

INSULATOR SUBSTRATE FOR A LIGHT VALVE DEVICE HAVING AN ELECTROSTATIC PROTECTION REGION

BACKGROUND OF THE INVENTION

The present invention relates to a semiconductor on insulator substrate, and more particularly to an input/output protection circuit for a MOS type integrated circuit formed in a silicon single crystal thin film on an insulation layer, and also relates to a light valve device using the semiconductor device.

Heretofore, an input/output protection circuit for an integrated circuit formed in a silicon single crystal thin film on an insulation layer has been generally formed in a silicon single crystal thin film device forming layer.

As shown in FIG. 2, since a conventional input/output protection circuit 104 for an integrated circuit on a silicon single crystal thin film 103 on an insulation layer 102 has been formed in the silicon single crystal thin film device forming layer 103 having the same thickness as a MOS type integrated circuit forming region 105 requiring high speed operation, there has been a problem in that a diode or a field transistor used as a device for the input/output protection circuit cannot realize sufficient function compared with the case of forming such a device on a bulk silicon substrate. This is attributable to the fact that the thickness of the silicon single crystal thin film device forming layer must be greatly reduced (less than 100 nm such that the channel region of the MOS type transistor is completely depleted in order to provide the high speed characteristic of the MOS type integrated circuit on the silicon single crystal thin film on the insulation layer and, if a normal diode or field transistor is formed on such a thin film, the junction portion of P- and N-type diffusion regions 106, 107 is restricted to the lateral side thereof in the case where the diode is formed as shown in FIG. 4, greatly reducing the junction area. Also, in the case of a field transistor, a field oxide film 110 reaches as far as a buried insulation film 102, as shown in FIG. 6, which results in the field transistor being unable to form.

Further, as shown in FIG. 13, in an active matrix liquid crystal display device in which a silicon single crystal thin film 103 is disposed on an insulation layer 102, a driving substrate 501 formed with a group of integrated circuits 502, 502' and a counter substrate 504 formed with a counter electrode 503 are disposed on an insulating substrate 102' film, the driving substrate and the counter substrate being bonded together with a gap therebetween and with a liquid crystal 505 disposed in the gap, a light valve device has been known in which the silicon single crystal thin film device region includes field effect thin film transistors 506 arranged in a matrix for selectively supplying a voltage to the liquid crystal layer 505 and driving circuits 502, 502', including MOS type thin film transistors for driving the field effect thin film transistors, and has an input terminal portion 507 for inputting signals from the outside to the driving circuit.

The light valve device can incorporate a driving circuit formed by single crystal silicon LSI technology and has a feature capable of reducing the number of connection terminals to the outside and having high precision and microscopic size. However, in the manufacturing step for the liquid crystal display device, since, for example, the semiconductor device is subjected to high speed rotation or cloth rubbing for the orienting treatment of liquid crystals in the manufacturing stage for the liquid crystal device, there has been a problem in that Electro Static Charge generated during the manufacturing stage leading to frequent inferiorities, and Electro Static Charge in the atmosphere during manufacture and where the finished product is placed intrudes into an input terminal portion 507 where a conductive film is exposed, destroying the device.

It is an object of the present invention to overcome the foregoing problem and provide a MOS integrated circuit formed in a silicon single crystal thin film on an insulation layer having an input/output protection circuit capable of providing sufficient function and a light valve device using the integrated circuit and provided with a sufficient countermeasure for Electro Static Charge.

SUMMARY OF THE INVENTION

The principal means adopted in the semiconductor device and the light valve device according to the present invention for attaining the aforegoing object, in order that a diode or a field transistor used as a device for an input/output protection circuit can provide sufficient function in a MOS integrated circuit formed in a silicon single crystal thin film on an insulation layer, comprises the steps of:

(1) making the thickness of a silicon single crystal thin film device forming layer in an input/output protection circuit forming region greater than the thickness of a silicon single crystal thin film device forming region in a MOS integrated circuit forming region requiring high speed operation, (2) forming an input/output protection circuit on a silicon single crystal substrate with a silicon single crystal thin film device forming layer and a buried insulation film on the silicon single crystal thin film on the insulation layer removed therefrom, and (3) forming a diode used as an element for the input/output protection device with a silicon single crystal thin film device forming layer on the single crystal thin film on the insulation layer and a polycrystal silicon layer formed on the silicon single crystal thin film device forming layer.

Thus, the MOS integrated circuit requiring high speed operation is formed in the single crystal thin film device forming layer with a film thickness being set such that a channel region is completely depleted (less than about 1000 Å) upon operation of a MOS transistor by way of the buried insulation film on the silicon single crystal substrate, so that electrostatic tolerance can be improved without sacrificing the high speed characteristic of the IC on the silicon single crystal thin film on the insulation layer. Further, a light valve device protected from electrostatic influence such as during the manufacturing stage can be manufactured by using a semiconductor device having the integrated circuit formed thereon.

In the semiconductor device according to the present invention, because the film thickness of the silicon single crystal thin film device forming layer of the input/output protection circuit forming region is made greater so that the input/output protection device can provide sufficient function in the MOS integrated circuit on the silicon single crystal thin film on the insulation layer, the input/output protection circuit is formed on a silicon single crystal substrate with the silicon single crystal thin film device forming layer on an SOI substrate and the buried insulation film removed, and the diode used as the element for the input/output protection circuit is formed with the silicon single crystal thin film device forming layer on the SOI substrate and the polycrystal silicon layer formed on the silicon single crystal thin film device forming layer, a diode or a field transistor used as the element for the input/output protection circuit can provide function equal to that in the case where it is formed on a bulk silicon substrate, and a MOS integrated circuit having sufficient resistance against the application of static electricity can be formed.

BRIEF DESCRIPTION OF THE DRAWINGS

FIG. 10 is a schematic cross sectional view of a diode used as an element for an input/output protection circuit of a semiconductor device according to the present invention, FIG. 11 is a schematic cross sectional view of a field transistor used as an element for an input/output protection circuit of a semiconductor device according to the present invention, FIG. 12 is a schematic cross sectional view illustrating an embodiment of a diode used as an element for an input/output protection circuit of a semiconductor device according to the present invention.

DETAILED DESCRIPTION OF THE PREFERRED EMBODIMENTS

A description of preferred embodiments of the present invention follows, with reference to the drawings.

Figure 1:
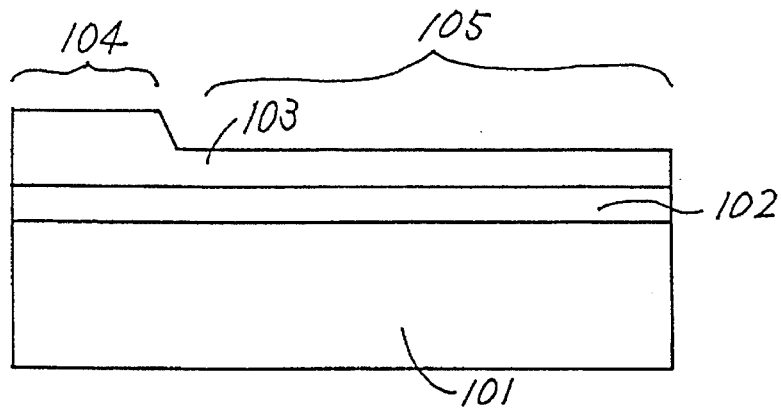
FIG. 1 is a schematic cross sectional view illustrating an embodiment of a semiconductor device according to the present invention.

FIG. 1 is a schematic cross sectional view illustrating one embodiment of a semiconductor substrate according to the present invention.

A silicon single crystal thin film device forming layer 103 is formed by way of a buried insulation film 102 on a silicon single crystal substrate 101. In this embodiment, the thickness of the silicon single crystal thin film device forming layer 103 in a MOS integrated circuit forming region 105 requiring high speed operation is determined such that a channel region is completely depleted upon operation of the MOS transistor (less than about 1000 Å). On the other hand, the thickness of the silicon single crystal thin film device forming layer 103 in an input/output protection circuit forming region 104 is made greater than the thickness of the MOS integrated circuit forming region 105 requiring high speed operation. The thickness of the silicon single crystal thin film device forming layer 103 in the input/output protection circuit forming region 104 is made greater than the thickness of a first conduction type diffusion region of a diode in the case where a diode is used as an element for the input/output protection circuit. Further, it has such a thickness that the bottom of a field oxide film of a field transistor does not reach the buried insulation film of the SOI substrate in the case where a field transistor is used as an element for the input/output protection circuit.

Figure 3:
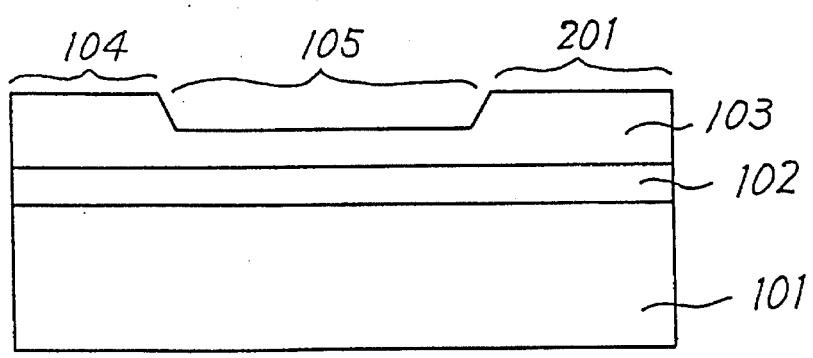
FIG. 3 is a schematic cross sectional view illustrating an embodiment of a semiconductor device according to the present invention.

FIG. 3 is a schematic cross sectional view illustrating another embodiment of the semiconductor substrate according to the present invention.

This embodiment is different from that shown in FIG. 1 in that a MOS integrated circuit forming region 201 not requiring high speed operation is also formed in addition to the MOS integrated circuit forming region 105 requiring high speed operation. The thickness of the silicon single crystal thin film device forming layer 103 in the MOS integrated circuit forming region 201 not requiring high speed operation is the same as the thickness of the silicon single crystal thin film device forming layer 103 in the input/output protection circuit forming region 104.

The thickness of the silicon single crystal thin film device forming layer 103 of the MOS integrated circuit forming region 105 requiring high speed operation is determined such that a channel region is completely depleted upon operation of the MOS transistor (less than about 1000 Å).

Figure 5:
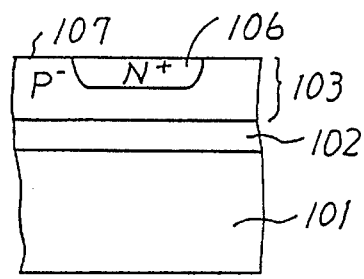
FIG. 5 is a schematic cross sectional view of a diode used as an element for an input/output protection circuit of a semiconductor device according to the present invention.

FIG. 5 is a schematic cross sectional view illustrating an embodiment of a diode used as an element for an input/output protection circuit of a semiconductor device according to the present invention.

Figure 4:
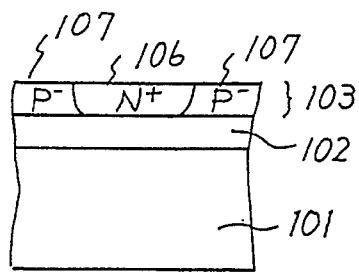
FIG. 4 is a schematic cross sectional view of a diode used as an element for an input/output protection circuit of a conventional semiconductor device.

Although in a conventional diode on a silicon single crystal thin film device forming layer 103 shown in FIG. 4, a junction portion for P- and N-type diffusion regions is restricted to the lateral side thereof to remarkably reduce the junction area, in the diode used as a device for the input/output protection device of the semiconductor device according to the present invention shown in FIG. 5, since the bottom of a N-type diffusion layer 106 is also in contact with a P-type diffusion layer 107, the junction area is increased, as well as which the concentration of the electric field can be moderated, and sufficient protection circuit, function can be realized.

Figure 7:
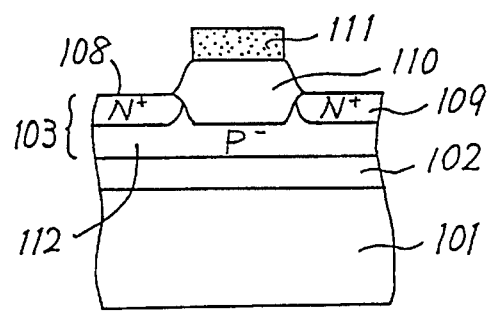
FIG. 7 is a schematic cross sectional view of a field transistor used as an element for an input/output protection circuit of a semiconductor device according to the present invention.

FIG. 7 is a schematic cross sectional view illustrating an embodiment of a field transistor used as an element for an input/output protection circuit of a semiconductor device according to the present invention. The field transistor comprises a source 108, a drain 109, a field oxide film 110 acting as a gate insulation film and a gate electrode 111.

Figure 6:
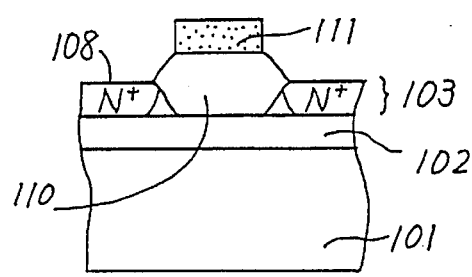
FIG. 6 is a schematic cross sectional view of a field transistor used as an element for an input/output protection circuit of a conventional semiconductor device.

In the field transistor on the conventional silicon single crystal thin film device forming layer 103 shown in FIG. 6, the field oxide film 110 reaches as far as the insulation film 102, failing to form a field transistor. On the other hand, in the field transistor used as the element for the input/output protection device of the semiconductor device according to the present invention, since it is formed in the silicon single crystal thin film device forming layer 103 having such a thickness that the bottom of the field oxide film of the field transistor does not reach the buried insulation film 102 of the SOI substrate, a satisfactory structure can be obtained.

In the embodiments shown in FIGS. 1, 3, 5 and 7, since the thickness of the silicon single crystal thin film device forming layer of the input/output protection circuit forming region is increased such that the input/output protection device can sufficiently realize its function, the diode or the field transistor used as the active device for the input/output protection circuit can provide a function equal to that in the case where it is formed on a bulk silicon substrate, and a MOS integrated circuit having a sufficient tolerance to the application of static electricity can be formed.

Figure 8:
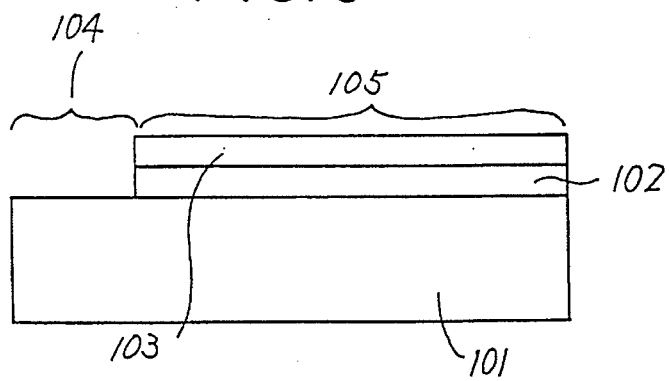
FIG. 8 is a schematic cross sectional view illustrating an embodiment of a semiconductor device according to the present invention.

FIG. 8 is a schematic cross sectional view showing another embodiment of a semiconductor device according to the present invention.

A silicon single crystal thin film device forming layer 103 is formed by way of a buried insulation film 102 on a silicon single crystal substrate 101. In this embodiment, the silicon single crystal thin film device forming layer 103 and the buried insulation layer 102 of an input/output protection circuit forming region 104 are removed, and the input/output protection circuit is formed on the silicon single crystal substrate 101. On the other hand, the silicon single crystal thin film device forming layer 103 of a MOS integrated circuit forming region 105 requiring high speed operation is formed by way of a buried insulation layer 102 on the silicon single crystal substrate 101. The thickness of the silicon single crystal thin film device forming layer 103 is determined such that a channel region is completely depleted upon operation of a MOS transistor (less than about 1000 Å).

FIG. 10 is a schematic cross sectional view illustrating an embodiment of a diode used as an active element for an input/output protection circuit of a semiconductor device according to the present invention.

Figure 9:
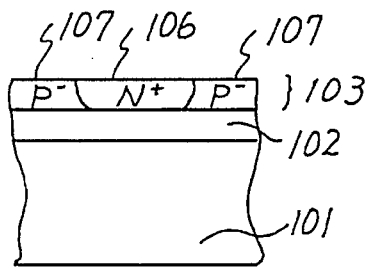
FIG. 9 is a schematic cross sectional view of a diode used as an element for an input/output protection circuit of a conventional semiconductor device.
Figure 13:
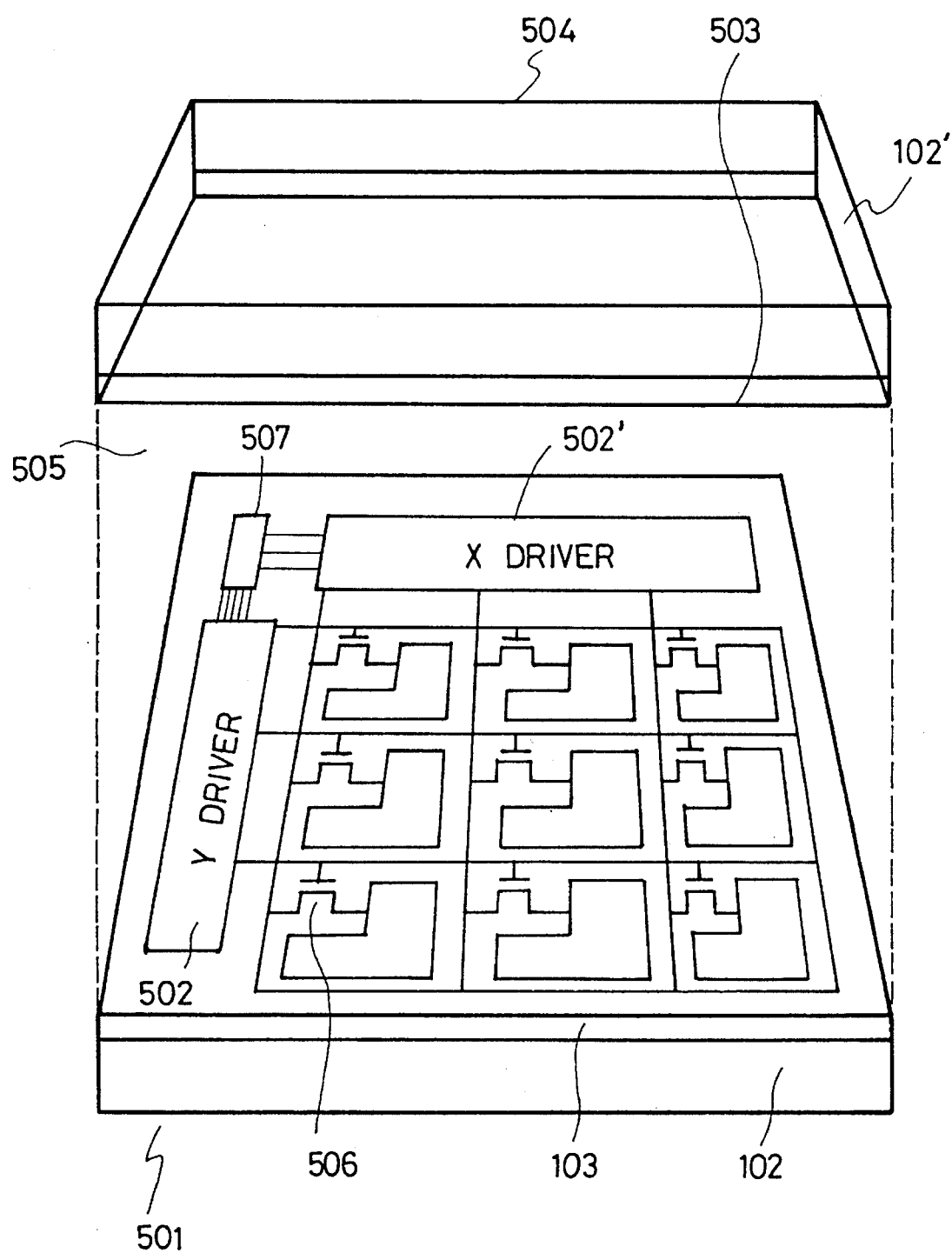
FIG. 13 is a schematic perspective view of a conventional light valve device.

In a diode shown in FIG. 9 on a conventional silicon single crystal thin film device forming layer 103, a junction portion for P- and N-type diffusion regions is restricted to the lateral side thereof to remarkably reduce the junction area. On the other hand, in a diode used as an element for an input/output protection circuit of a semiconductor device according to the present invention, since the bottom of an N-type diffusion layer 106 is also in contact with the P-type diffusion region 107, the junction area is increased, and, since the concentration of the electric field can be moderated, the protection circuit can sufficiently realize its function.

FIG. 11 is a schematic cross sectional view illustrating an embodiment of a field transistor used as an active element for an input/output protection circuit of a semiconductor device according to the present invention.

In the field transistor on a conventional silicon single crystal thin film device forming layer 103, a field oxide film reaches as far as a buried insulation film, failing to form the field transistor. On the other hand, since the field transistor used as the active device for the input/output protection circuit of the semiconductor device according to the present invention shown in FIG. 11 is formed on the silicon single crystal substrate 112, a satisfactory structure can be obtained.

According to the embodiments shown in FIGS. 8, 10 and 11, since the active device of the input/output protection circuit is formed on the single silicon crystal substrate with the silicon single crystal thin film device forming layer and the buried insulation film on the SOI substrate removed, the diode or field transistor used as the active element for the input/output protection circuit can provide a function equal to that in a case where it is formed on a bulk silicon substrate, and a MOS integrated circuit having sufficient tolerance to the application of static electricity can be formed.

FIG. 12 is a schematic cross sectional view illustrating an embodiment of a diode used as an element for an input/output protection circuit according to the present invention.

Figure 2:
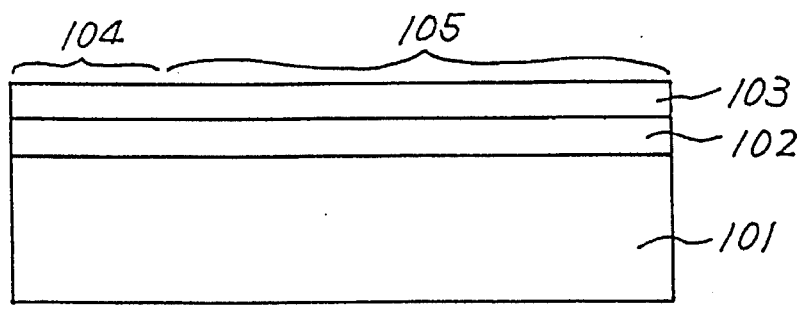
FIG. 2 is a schematic cross sectional view illustrating an embodiment of a conventional semiconductor device.

A silicon single crystal thin film device forming layer 103 is formed by way of a buried insulation film 102 on a silicon single crystal substrate 101. In this embodiment, the diode used as the active element for the input/output protection circuit is formed with a silicon single crystal thin film device forming layer 103 on an SOI substrate and an N-type polycrystal silicon layer 301 formed on the silicon single crystal thin film device forming layer 103. In the diode in the conventional silicon single crystal thin film device forming layer 103 shown in FIG. 2, a junction portion for the P-type diffusion region 107 and the N-type diffusion region 106 is restricted to the lateral side thereof, to greatly reduce the junction area. On the other hand, in the diode used as the element for the input/output protection circuit of the semiconductor device according to the present invention, since the N-type region is formed with the N-type polycrystal silicon layer 301, and the bottom of the N-type polycrystal silicon layer 301 is in contact with the P-type diffusion layer 107, the junction area is increased, and, since the concentration of the electric field can be moderated, the protection circuit can sufficiently realize its function.

Although a description of FIG. 12 is set forth above for a case where the N-type polycrystalline silicon layer is formed on the silicon single crystal thin film device forming layer 103 and the P-type diffusion region 107 is formed in the silicon single crystal thin film device forming layer, a P-type polycrystalline silicon layer may be formed in the silicon single crystal thin film device forming layer 103, while an N-type diffusion layer may be formed in the silicon single crystal thin film device forming layer 103.

According to the embodiment shown in FIG. 12, the diode used as the active element for the input/output protection circuit in a MOS integrated circuit formed in a silicon single crystal thin film on an insulation layer can provide a function equal to that in case where it is formed within a bulk silicon substrate, and a MOS integrated circuit having a sufficient resistance to the application of static electricity can thus be formed.

Figure 14:
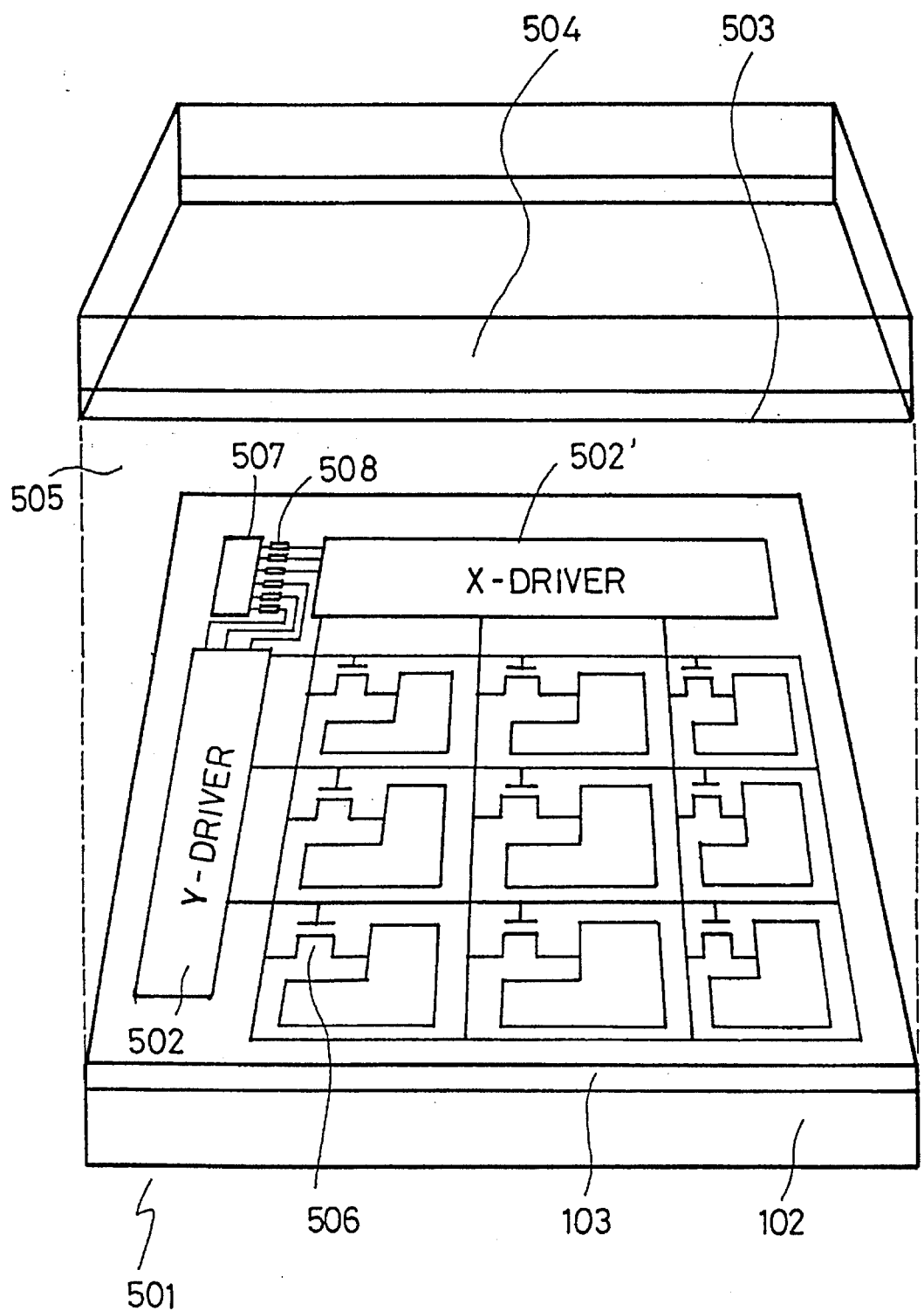
FIG. 14 is a schematic perspective view illustrating an embodiment of a light valve device according to the present invention.

FIG. 14 is a schematic perspective view illustrating an embodiment of a light valve device according to the present invention. A silicon single crystal thin film 103 is disposed on an insulation layer 102, a driving substrate 501, formed with a group of integrated circuits 502, 502', and a counter substrate 504 formed with a counter electrode 503 are disposed on the silicon single crystal thin film 103, the driving substrate 501 and the counter substrate 504 being bonded together with a predetermined gap therebetween and a liquid crystal layer 505 is disposed in the gap. The group of integrated circuits 502, 502' includes an input protection circuit region or output protection circuit region 507.

The silicon single crystal thin film device region 103 includes field effect thin film transistors 506 arranged in a matrix for supplying voltage selectively to the liquid crystal layer 505 and driving circuits 502, 502' including the MOS thin film transistors for driving the field effect thin film transistors 506, and the input protection circuit region or the output protection circuit region 507 is constituted by the group of input/output protection devices 508 according to the present invention as shown, for example, in FIGS. 1, 3 5, 7, 8, 10, 11 and 12.

According to the embodiment shown in FIG. 14, the semiconductor device used for the light valve device can be provided with effective protection against static electricity either during manufacturing steps or as completed products.

As has been described above, in order to fully attain the function of the input/output protection circuit in the MOS integrated circuit on the silicon single crystal thin film on the insulation layer according to the present invention, since (1) the thickness of the silicon single crystal thin film device forming layer of the input/output protection circuit forming region is increased, (2) the input/output protection circuit is formed on the silicon single crystal substrate with the silicon single crystal thin film device forming layer and the buried insulation layer on the SOI substrate removed and (3) the diode used as the element for the input/output protection circuit is formed with the silicon single crystal single device forming layer on the SOI substrate and the polycrystal silicon layer formed on the silicon single crystal forming device forming layer, the diode or the field transistor used as the element for the input/output protection circuit can provide a function equal to that in the case of being formed on a bulk silicon substrate, and a MOS integrated circuit having sufficient tolerance to the application of static electricity can be formed. On the other hand, the MOS integrated circuit requiring high speed operation is formed on a silicon single crystal thin film device forming layer formed by way of a buried insulation film on the silicon single crystal substrate, and the thickness of the silicon single crystal thin film device forming layer is determined such that the channel region is completely depleted upon operation of the MOS transistor (less than about 1,000 Å. As a result, electrostatic discharge tolerance can be improved without sacrificing the high speed characteristic of the IC on the SOI substrate.

Further, a highly precise and compact light valve device having a driving circuit comprising silicon single crystals and sufficiently protected against Electro Static Charge can be attained.

What is claimed is:

1. A semiconductor substrate having a silicon single crystal thin film on an underlying insulation layer, the semiconductor substrate comprising: an input/output protection circuit region and a silicon single crystal device region which are formed on the silicon single crystal thin film; wherein the thickness of the silicon single crystal thin film in the input/output protection circuit region is greater than the thickness of the silicon single crystal thin film in the device region to protect the silicon single crystal device region from an electro-static damage.

2. A semiconductor substrate according to claim 1; wherein the silicon single crystal thin film has a second conductivity type in the input/output protection circuit region, the input/output protection circuit region includes a diode having a diffusion region of a first conductivity type formed in the silicon single crystal thin film, and the diffusion region is physically separated from the underlying insulating layer.

3. A semiconductor substrate according to claim 1; wherein the input/output protection circuit region includes a transistor comprising a source region and a drain region which are formed in the silicon single crystal thin film, a field oxide film formed on the silicon single crystal thin film and a gate electrode formed on the field oxide film, the field oxide film of the transistor being physically separated from the underlying insulation layer.

4. A semiconductor substrate having a silicon single crystal thin film on an underlying insulation layer, the semiconductor substrate comprising: an input/output protection circuit region and a silicon single crystal device region which are formed on the silicon single crystal thin film; wherein the input/output protection circuit region includes a diode having a polycrystalline silicon layer formed on the silicon single crystal thin film to protect the silicon single crystal device region from an electro-static damage; and wherein the thickness of the silicon single crystal thin film in the input/output protection circuit region is greater than the thickness of the silicon single crystal thin film in the device region.

5. A semiconductor-on-insulator substrate comprising: a single crystal semiconductor thin film having an integrated circuit region and an electrostatic protection region, the thickness of the single crystal semiconductor thin film being greater in the electrostatic protection region than in the integrated circuit region to allow high speed operation of devices formed in the integrated circuit region; and an insulation film underlying the single crystal semiconductor thin film.

6. A semiconductor on insulator substrate according to claim 5; wherein the single crystal semiconductor thin film is a single crystal silicon thin film.

7. A semiconductor on insulator substrate according to claim 6; wherein the thickness of the single crystal silicon thin film in the integrated circuit region is less than 1000 Å.

8. A semiconductor on insulator substrate according to claim 5; wherein the electrostatic protection region includes a transistor having a field oxide film formed on the single crystal semiconductor thin film so as to be physically spaced from the underlying insulation film.

9. A semiconductor on insulator substrate according to claim 5; wherein the electrostatic protection region includes a diode having a diffusion region formed in the single crystal semiconductor thin film such that a bottom of the diffusion region is physically spaced from the underlying insulation film.

10. A semiconductor substrate comprising: a semiconductor thin film having a first region and a second region, the thickness of the semiconductor thin film being greater in the first region than in the second region; and an insulation film underlying the semiconductor thin film; wherein the first region is an electrostatic protection region including an electrostatic protection device effective to protect the second region from exposure to an excess of electro-static charge.

11. A semiconductor substrate comprising: a semiconductor thin film having a first region and a second region, the thickness of the semiconductor thin film being greater in the first region than in the second region; and an insulation film underlying the semiconductor thin film; wherein the first region is an electrostatic protection region including a transistor having a field oxide film formed on the semiconductor thin film so as to be physically separated from the underlying insulation film.

12. A semiconductor substrate comprising: a semiconductor thin film having a first region and a second region, the thickness of the semiconductor thin film being greater in the first region than in the second region; and an insulation film underlying the semiconductor thin film; wherein the first region is an electrostatic protection region including a diode having a diffusion region formed in the semiconductor thin film so as to be physically separated from the underlying insulation film.

13. In a light valve having a driving substrate, a physically opposed counter substrate and a liquid crystal layer disposed between the driving substrate and the counter substrate, the driving substrate comprising: a semiconductor thin film having a first region and a second region, the thickness of the semiconductor thin film being greater in the first region than in the second region; and an insulation film underlying the semiconductor thin film; wherein the second region is an integrated circuit region having thin film switching transistors for selectively applying a voltage to the liquid crystal layer and thin film driving transistors for driving the thin film switching transistors, and the first region is an electrostatic protection circuit region having an electrostatic protection device electrically connected to the integrated circuit region, the electrostatic protection device effective to protect the driving transistors from exposure to an excess of electrostatic charge.

* * * * *